United States Patent [19]

Sugishita

[11] Patent Number: 5,828,160

[45] Date of Patent: Oct. 27, 1998

[54] PIEZOELECTRIC TRANSDUCER

[75] Inventor: Takao Sugishita, Minato-ku, Japan

[73] Assignee: U.S. Philips Corporation, New York, N.Y.

[21] Appl. No.: 926,840

[22] Filed: Sep. 10, 1997

Related U.S. Application Data

[63] Continuation of Ser. No. 561,959, Nov. 22, 1995, abandoned.

[30] Foreign Application Priority Data

Nov. 25, 1994 [JP] Japan .................................. 6-315791

[51] Int. Cl.$^6$ .................................................. H01L 41/08
[52] U.S. Cl. ............................................ 310/366; 310/359
[58] Field of Search .................................. 310/328, 359, 310/366

[56] References Cited

U.S. PATENT DOCUMENTS

| | | | |
|---|---|---|---|
| 3,590,287 | 6/1971 | Berlincourt et al. | 310/328 |
| 3,610,969 | 10/1971 | Clawson et al. | 310/359 |
| 4,633,120 | 12/1986 | Sato et al. | 310/328 |
| 4,780,639 | 10/1988 | Shirasu | 310/328 |
| 4,954,811 | 9/1990 | Chatigny et al. | 340/550 |
| 5,118,982 | 6/1992 | Inoue et al. | 310/328 |
| 5,128,544 | 7/1992 | Iwatsuki | 310/328 |
| 5,168,189 | 12/1992 | Dam et al. | 310/328 |
| 5,241,236 | 8/1993 | Sasaki et al. | 310/328 |
| 5,271,133 | 12/1993 | Dam et al. | 310/328 |
| 5,278,471 | 1/1994 | Uehara et al. | 310/328 |
| 5,341,061 | 8/1994 | Zaitsu | 310/318 |
| 5,345,137 | 9/1994 | Funakubo et al. | 310/328 |
| 5,367,500 | 11/1994 | Ng | 310/328 |
| 5,440,195 | 8/1995 | Ohnishi et al. | 310/359 |

FOREIGN PATENT DOCUMENTS

| | | | |
|---|---|---|---|
| 0144655 | 6/1985 | European Pat. Off. | 310/328 |
| 52-35994 | 3/1977 | Japan | 310/328 |
| 62-165380 | 7/1987 | Japan | 310/328 |
| 5235432 | 9/1993 | Japan | H01L 41/107 |
| 9206511 | 4/1992 | WIPO | 310/328 |

*Primary Examiner*—Thomas M. Dougherty
*Attorney, Agent, or Firm*—Daniel E. Tierney

[57] ABSTRACT

A piezoelectric transducer has groups of a first part and second part therebetween. Thin piezoelectric ceramic layers in groups and thick piezoelectric ceramic layers in the second part are polarized in the direction of thickness A or B. All of electrodes are layers, and each electrode is provided between the piezoelectric ceramic layers. A step-up output voltage is generated between the piezoelectric ceramic layers of the second part by longitudinal vibration of the piezoelectric ceramic layers of the groups.

4 Claims, 2 Drawing Sheets

PIEZOELECTRIC TRANSDUCER

This is a continuation of application Ser. No. 08/561,959, filed Nov. 22, 1995 now abandoned.

BACKGROUND OF THE INVENTION

The present invention relates to a piezoelectric transducer which has a low output impedance and can be operated at a high frequency in the practical range. The piezoelectric transducer according to the invention is especially useful for a DC—DC converter which is accommodated in a facsimile device or used for a high pressure generating tube of an ozone generator.

A typical conventional piezoelectric transducer known as the Rosen type transducer is illustrated in the book "Piezoelectric Ceramics" by B. Jaffe, W. R. Cook Jr. and H. Jaffe, published by arrangement with Academic Press Limited in 1971, at page 278. The Rosen type transducer comprises a piezoelectric ceramic element in the form of an elongated plate. A first part of the plate is polarized in the direction of thickness and interposed between a pair of electrodes. A second part of the piezoelectric ceramic element is polarized in the direction of length and is provided with two electrodes, one being at the end of the piezoelectric ceramic element remote from the first part, the other being identical with one of the electrodes of the first part. When an alternating voltage with a resonant frequency, corresponding to the longitudinal dimension of the piezoelectric ceramic element, is applied across the electrodes of the first part, a large mechanical oscillation in the direction of length is generated by the piezoelectric effect. This oscillation is converted into an output voltage at the second part by the piezoelectric effect, so that a high voltage is generated between the electrodes of the second part. Thus, an input electric energy is converted into a mechanical energy which is subsequently converted into a large output voltage, which voltage can be a few hundreds times as large as the input voltage.

A piezoelectric transducer in the form of a flat plate with a plurality of piezoelectric ceramic layers is also known from Japanese patent application laid-open No. 18776/92 and U.S. Pat. No. 5,118,982. This piezoelectric transducer comprises a first part and a second part each part comprising piezoelectric ceramic layers polarized in the direction of thickness and electrodes each interposed between the adjacent piezoelectric ceramic layers. The piezoelectric ceramic layer of the first part and the second part are different in thickness. This conventional piezoelectric transducer is advantageous in that, since the mechanical oscillation in the direction of thickness is utilized, it has a low output impedance and can be driven at a high frequency.

When the Rosen type transducer is manufactured, the polarization in the direction of its length requires a higher voltage as compared with the polarization in the direction of its thickness. Furthermore, since a distance between the electrodes of the second part is large, the output impedance is large. As a result, the output voltage depends on the load impedance. The ratio of the output voltage to the input voltage also depends on the load impedance.

The known piezoelectric transducer having a plurality of piezoelectric ceramic layers requires an input voltage with a high frequency, for example a few MHz. This is because the resonant frequency for mechanical oscillation of a piezoelectric ceramic layer depends on the dimension of the piezoelectric ceramic layer in the direction of the oscillation, i.e. the thickness. The piezoelectric ceramic layer of the known transducer should therefore be oscillated at a very high frequency. However, it is in practice difficult to have the piezoelectric ceramic layer oscillated at very high frequencies. Furthermore, at a high frequency oscillation, such as a few MHz, the dielectric loss is large, so that the converting efficiency becomes low. An unexpected longitudinal oscillation also occurs by the effect of thickness vibration of the piezoelectric ceramic layer. Since the resonant frequency of the thickness oscillation is a high frequency such as a few MHz, while the resonant frequency of the longitudinal vibration is a low frequency, the unexpected longitudinal vibration includes spurious components with high orders of the longitudinal resonant frequency. Since the longitudinal vibration thus occurs, the converting efficiency of the transducer is even more reduced.

SUMMARY OF THE INVENTION

It is an object of the invention to provide a piezoelectric transducer with a small output impedance and a high converting efficiency, which is suitable for miniaturization and for driving at a high frequency in a practical range.

To this end, a piezoelectric transducer having a first part and a second part, each part comprising piezoelectric ceramic layers with internal electrode layers therebetween, which piezoelectric ceramic layers are polarized in the direction of thickness is characterized in that the piezoelectric ceramic layers of the first part are separated into two groups which enclose the piezoelectric ceramic layers of the second part; and in that materials of the piezoelectric ceramic layers of the first part and the second part have an electromechanical coupling coefficient $K_{31}$ of at least 0.3. With the transducer according to the invention, an output voltage of the piezoelectric ceramic layers of the second part can be generated by applying a voltage to the first part which voltage has a resonant frequency in the direction perpendicular to the thickness of the piezoelectric ceramic layers of the first part or of the second part.

Furthermore, a first preferred embodiment of the piezoelectric transducer according to the invention is characterized in that the thickness of the piezoelectric ceramic layers of the first part is greater than the thickness of the piezoelectric ceramic layers of the second part. In a secondly preferred embodiment of the inventive transducer the thickness of the piezoelectric ceramic layers of the first part is smaller than the thickness of the piezoelectric ceramic layers of the second part. In the first embodiment, the piezoelectric transducer according to the invention is used as a step-down transducer. In the second embodiment, the piezoelectric transducer according to the invention is used as a step-up transducer.

Another preferred embodiment of the piezoelectric transducer according to the invention is characterized in that a decoupling layer is provided between the first part and the second part which decoupling layer comprises a material whose relative dielectric constant is lower than that of a material of the piezoelectric ceramic layers.

When a piezoelectric transducer according to the invention is used, it is not necessary to apply a large voltage across the piezoelectric ceramic layers for polarization in the direction of thickness because the thickness of the layers is small. The output impedance is proportional to the distance between the electrodes which enclose the piezoelectric ceramic layers. Since the distance between the electrodes according to the present invention corresponds to the thickness of a single piezoelectric ceramic layer, the output impedance can be small. Since the output impedance is small, the ratio of the output voltage to the input voltage is less dependent on the load impedance. Since the piezoelectric transducer according to the invention comprises a plurality of piezoelectric ceramic layers, a large output current can be obtained. Whether the piezoelectric transducer is a step-up type or a step-down type depends on the difference in thickness between the piezoelectric ceramic layers of the first part and the piezoelectric ceramic layers of the second part. Anyway, the output impedance of each transducer is small because the distance between the electrodes of each transducer is small.

The aspect ratio of the transducer according to the invention may preferably be at least 1.5. When the length of the transducer is nearly equal to its width, the resonant frequency in the longitudinal direction may be nearly equal to the resonant frequency in the direction of thickness, so that the converting efficiency becomes low.

The piezoelectric transducer according to the invention makes use of the piezoelectric effect by a longitudinal vibration. A material suitable for longitudinal vibration requires an electromechanical coupling coefficient $k_{31}$ of at least 0.3. PZT or PLZT may preferable be used as a material of the piezoelectric ceramic layer. For example, PZT comprises $PbZrO_3$, $PbTiO_3$ and its mixtures. The ratio of $PbZrO_3$ to PZT may be between 52% and 57% in order to realize that $K_{31}$ is more than 0.3. PZT with $k_{31}$ of more than 0.3 shown in the aforementioned book "Piezoelectric Ceramics", at page 143. PXE54 (Philips) may be also used as the piezoelectric ceramic material. The resonant frequency of the piezoelectric ceramic layer depends on the piezoelectric material and the dimension of the piezoelectric transducer in the direction of the vibration as shown in the following equation $$f = \frac{n}{2l(s^E)^{1/2}} \quad (n = 2m - 1) \tag{1}$$

wherein 'f' is the resonant frequency, 'l' the length of the piezoelectric transducer," the density of the material of the piezoelectric ceramic layer, 's' the sound velocity, 'E' the mechanical compliance in the longitudinal direction, and 'n' and 'm' constant values. Since the longitudinal resonant frequency of the piezoelectric ceramic layer according to the invention is preferably about 100 kHz, it is not difficult to drive the piezoelectric transducer, which means the piezoelectric transducer according to the invention can have a driving frequency in a practical range.

Since the second part of the piezoelectric transducer is interposed between the two groups of the first part like a sandwich, the piezoelectric transducer is not laterally bent. Therefore, the energy loss by an oscillation in the bending mode is small.

Furthermore, a decoupling layer with a low relative dielectric constant is preferably provided between a first part and a second part, so that an interference at the boundary between the first part and the second part does not occur. The degradation of the converting efficiency of the piezoelectric transducer can be diminished by this measure.

Hereinafter, the invention will be described in detail, by way of example, on the basis of some embodiments and with reference to the drawings.

DETAILED DESCRIPTION

Figure 1:
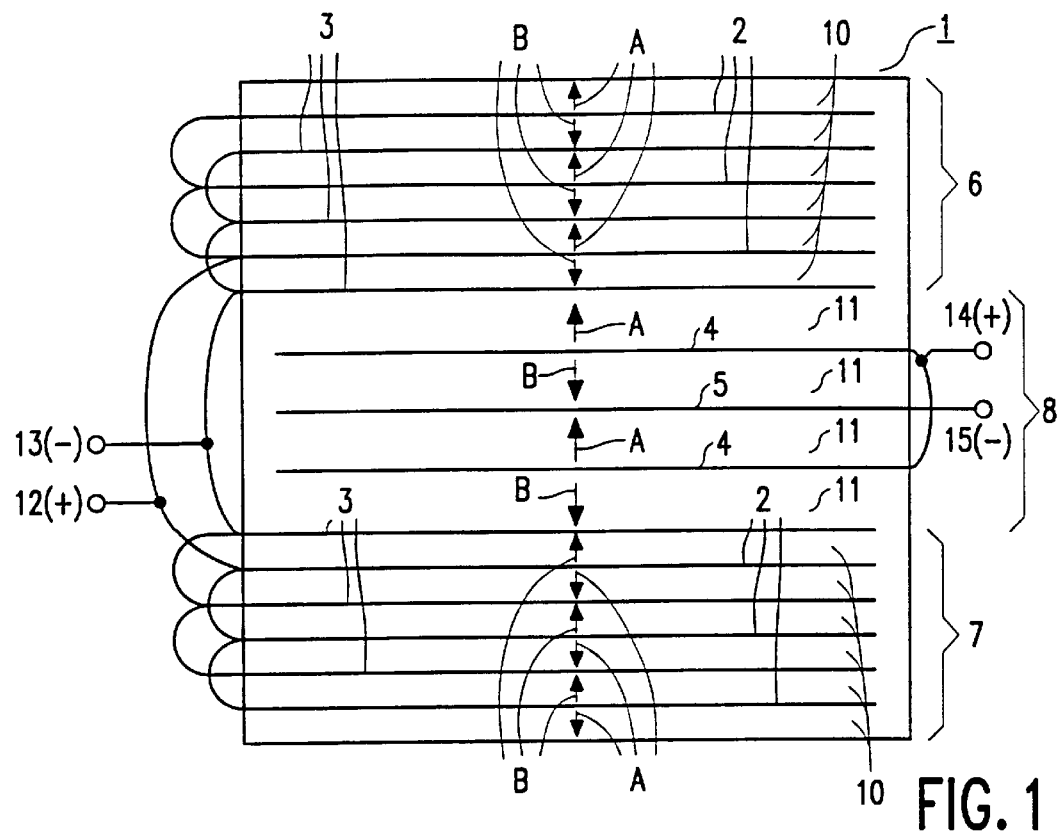
FIG. 1 shows a cross-sectional view of a first embodiment of a piezoelectric transducer according to the invention.
Figure 2:
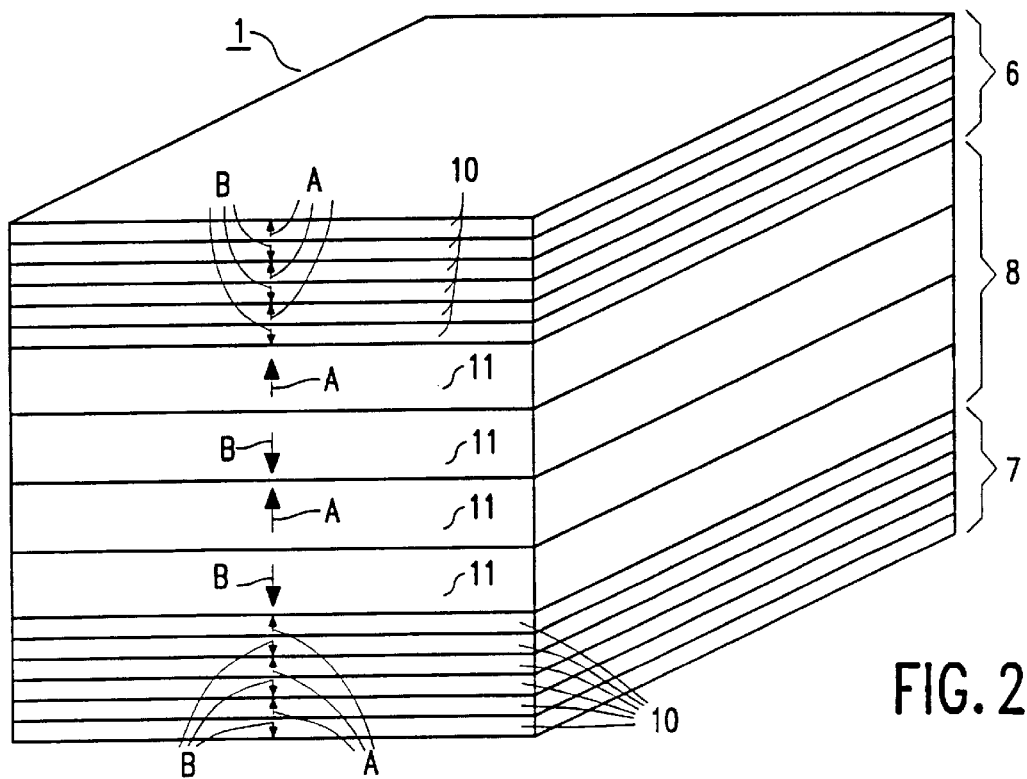
FIG. 2 shows a perspective view of the first embodiment of the piezoelectric transducer.

In FIGS. 1 and 2, a piezoelectric transducer 1 comprises two groups 6 and 7 of the first part in each of which a number of thin piezoelectric ceramic layers 10 each having a rectangular shape and polarized in the direction of thickness as indicated arrows A and B are multi-layered and a second part 8 in which a number of thick piezoelectric ceramic layers 11 are multi-layered and polarized in the direction of thickness, the second part 8 being interposed between the two groups 6 and 7 of the first part.

Electrodes 2, 3, 4 and 5 are all in the form of a flat layer. The piezoelectric ceramic layers 10 or 11 which are polarized in the direction of thickness, are interposed between these electrodes. The piezoelectric ceramic layers 10 and 11 have been polarized by applying a strong electric field in the direction of A or B before they were multilayered. The piezoelectric ceramic layers 10 and 11 are arranged in such a way that the polarized direction of each layer is alternatively inverted. A piezoelectric transducer with such internal multi-layered electrodes can be manufactured by the known multi-layer ceramic technologies which are used in the field of multi-layered ceramic capacitors. In the piezoelectric transducer manufactured in such a method, the thickness of the layer can be made small up to about 10 to 25 $\mu$m. The materials of the piezoelectric ceramic layers 10 and 11 should preferably be very sensitive to longitudinal oscillation. This is because, when the electromechanical coupling coefficient $K_{31}$ of the piezoelectric ceramic layer material is below 0.3, the converting efficiency of the piezoelectric transducer becomes significantly low. In this embodiment, a PZT material having an electromechanical coupling coefficient $K_{31}$ of 0.35 is used. Such piezoelectric material with $K_{31}$ of 0.35 can be easily obtained from the teachings of the aforementioned book "Piezoelectric Ceramics" by B. Jaffe, W. R. Cook Jr. and H. Jaffe, at page 143. The thickness, width and length of each piezoelectric ceramic layer 10 of the first part are 20 $\mu$m, 6 mm and 12 mm, respectively. The aspect ratio of length to width is thus 2. The number of the piezoelectric ceramic layers 10 of the first part is 12 in total. The two groups 6 and 7 each comprise six layers, and enclose the second part 8 having piezoelectric ceramic layers 11. The thickness, width and length of each piezoelectric layer 11 of the secondary part 8 are 80 $\mu$m, 6 mm and 12 mm, respectively. The number of the piezoelectric ceramic layers 11 of the secondary part is 4. The electrodes 2, 3, 4 and 5 are interposed between the piezoelectric ceramic layers 10 or 11 so that a voltage can be applied across each piezoelectric ceramic layer in the direction of A or B. An AgPd alloy is used as the electrode material. In order to be able to apply a voltage to each piezoelectric ceramic layer 10, each electrode 2, 3 in the two groups 6 and 7 is connected with every two electrodes and with a positive electrode terminal 12 or with a negative electrode terminal 13. Each electrode 4, 5 in the second part 8 is also connected with every two electrodes and with a positive electrode terminal 14 or with a negative electrode terminal 15. The negative electrode terminal 13 of the first part and the negative electrode terminal 15 of the second part may be inter-connected to be at the same potential.

An alternating voltage of about 2 V is applied across the terminals of the groups 6 and 7. The frequency of the alternating voltage is 120 kHz, which frequency is nearly equal to a first order of a resonant frequency in the longitudinal direction of the piezoelectric ceramic layers 10 and 11. As a result, the piezoelectric ceramic layers 10 of groups 6 and 7 are oscillated in the longitudinal direction by the piezoelectric effect. Since the piezoelectric ceramic layers 10 of groups 6 and 7 are oscillated in the longitudinal direction, the piezoelectric ceramic layers 11 of second part 8 are also oscillated in the longitudinal direction. Since the piezoelectric ceramic layers 11 are thus oscillated in the longitudinal direction, a voltage is generated between the electrodes 4 and 5 of the second part 8 by the piezoelectric effect. The generated voltage is proportional to a distance between the electrodes in the second part, so that an output voltage of about 8 V is obtained between the terminals 14 and 15. The ratio of the output voltage to the input voltage corresponds to the ratio of the thickness of the second part to that of the first part. In this embodiment, the ratio of the output voltage to the input voltage is about 4. Since the second part 8 is sandwiched between the groups 6 and 7, the piezoelectric transducer 1 itself will not be laterally bent. Since the thickness of the piezoelectric ceramic layers 11 of the second part 8 is thin, i.e. 80 $\mu$m, an output impedance is much lower as compared with the output impedance of the Rosen type transducer. In this embodiment, the output voltage between the terminals 14 and 15 is about 8 V even when a load impedance is more than 10.

Figure 3:
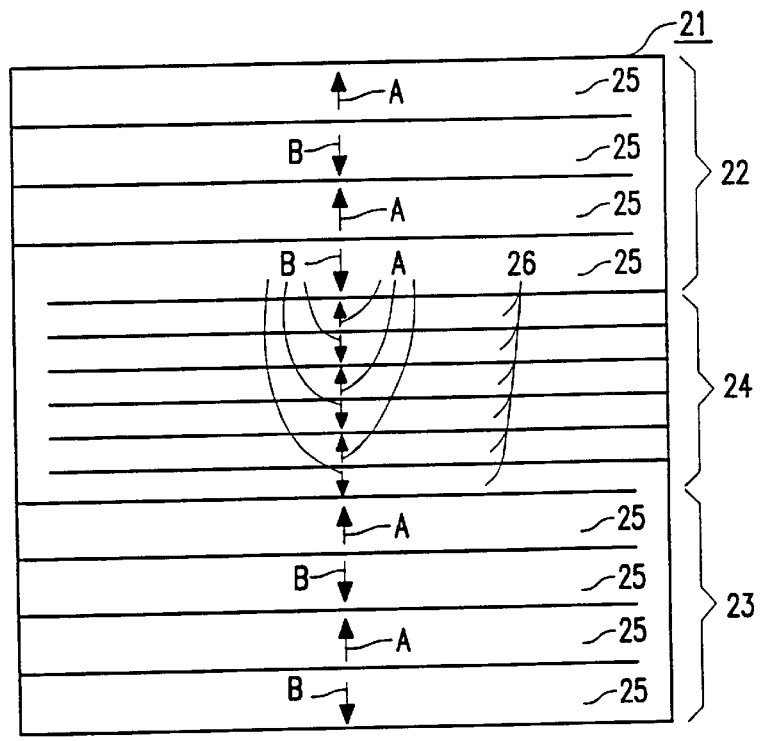
FIG. 3 shows a cross-sectional view of a second embodiment of a piezoelectric transducer of the invention.

FIG. 3 is a cross-sectional view of a piezoelectric transducer of a second embodiment according to the invention. Groups 22 and 23 of the first part of the piezoelectric transducer 21 comprise piezoelectric ceramic layers 25, each being polarized in the direction A or B. A second part 24 thereof comprises piezoelectric ceramic layers 26 each polarized in the direction of A or B. The piezoelectric ceramic layer 25 is thicker than the piezoelectric ceramic layer 26. As a result, the piezoelectric transducer 21 can be used as a step-down transducer.

Figure 4:
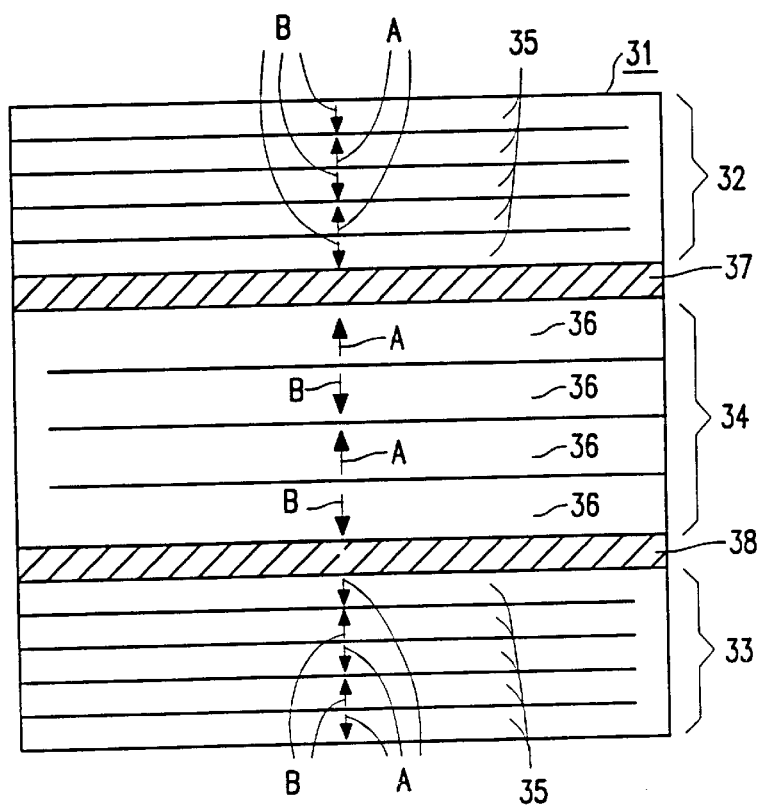
FIG. 4 shows a cross-sectional view of a third embodiment of a piezoelectric transducer according to the invention.

FIG. 4 is a cross-sectional view of a piezoelectric transducer of a third embodiment according to the invention. Decoupling layers 37 and 38 are provided between groups 32 and second part 34 and between a group 33 and second part 34, respectively. These decoupling layers 37 and 38 are made of a material, for example $Al_2O_3$, with a low relative dielectric constant. According to the above-mentioned two embodiments shown in FIGS. 1, 2 and 3, the converting efficiency may be rather low at the part between the groups and the second part because of the interference of the piezoelectric effect. According to this embodiment, the decoupling layer with a low relative dielectric constant is provided between the piezoelectric ceramic layers 35 and 36, so that the interference between the groups of the primary part and the second part does not occur. Therefore, the degradation of the converting efficiency can be diminished.

As described above, according to the invention, a piezoelectric transducer having a small output impedance and suitable for miniaturization and for driving at a high frequency in a practical range can be obtained.

What is claimed is:

1. A piezoelectric transducer for receiving an input electrical signal and generating an output electrical signal, said transducer having a first part and a second part, each part comprising stacked piezoelectric ceramic layers with internal electrode layers therebetween, which piezoelectric ceramic layers are polarized in the direction of thickness, characterized in that the piezoelectric ceramic layers of the first part are separated into two groups which enclose the piezoelectric ceramic layers of the second part along an axis normal to the layers of the first and second parts, a first pair of electrodes, each of the first pair of electrodes electrically interconnected with one or more of the internal electrodes between the ceramic layers of the first part and each of the first pair of electrodes electrically connected to an input interface for receiving input electrical signals, a second pair of electrodes, each of the second pair of electrodes electrically interconnected with one or more of the internal electrodes between the ceramic layers of the second part and each of the second pair of electrodes electrically connected to an output interface for transmitting the output electrical signals, the ceramic layers of the first part and second part coupled so that mechanical oscillations generated in the ceramic layers by the input electrical signals received at the input interface are converted into output electrical signals at the output interface; in that materials of the piezoelectric ceramic layers of the first part and the second part have an electromechanical coupling coefficient $K_{31}$ of at least 0.3.

2. A piezoelectric transducer as claimed in claim 1, characterized in that the thickness of the piezoelectric ceramic layers of the first part is greater than the thickness of the piezoelectric ceramic layers of the second part.

3. A piezoelectric transducer as claimed in claim 1, characterized in that the thickness of the piezoelectric ceramic layers of the first part is smaller than the thickness of the piezoelectric ceramic layers of the second part.

4. A piezoelectric transducer as claimed in claim 1, characterized in that a decoupling layer is provided between the first part and the second part which decoupling layer comprises a material whose relative dielectric constant is lower than that of materials of the piezoelectric ceramic layers.

\* \* \* \* \*